Figure 1:
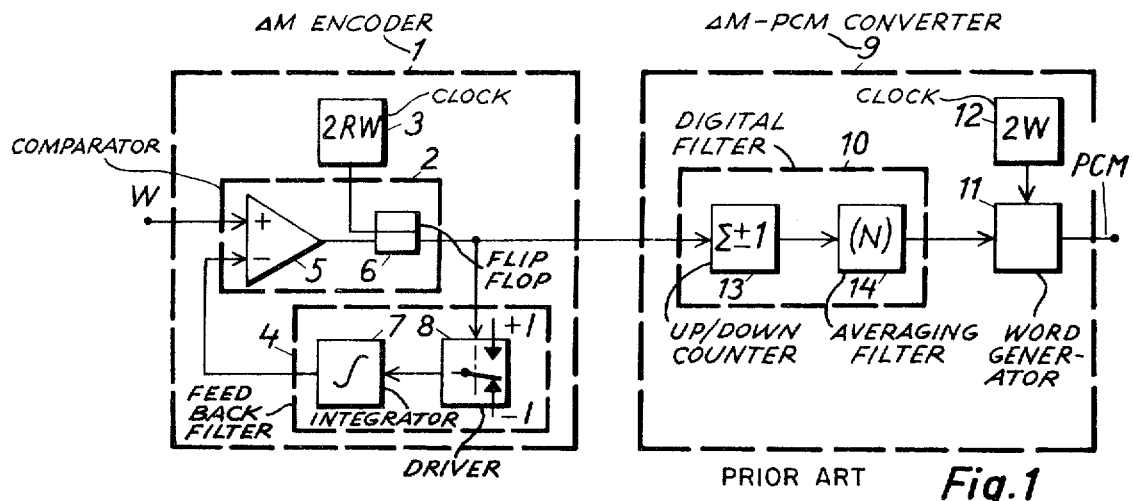

United States Patent [19]
Sparrendahl

[11] 3,962,636
[45] June 8, 1976

[54] DEVICE FOR CONVERTING AN INCOMING ANALOG SIGNAL INTO AN OUTGOING PCM SIGNAL

[75] Inventor: Gunnar Erik William Sparrendahl, Handen, Sweden

[73] Assignee: Telefonaktiebolaget L M Ericsson, Stockholm, Sweden

[22] Filed: Dec. 5, 1974

[21] Appl. No.: 529,800

[30] Foreign Application Priority Data
Dec. 21, 1973 Sweden............................ 73173742

[52] U.S. Cl................................. 325/38 B; 178/68
[51] Int. Cl.² ....................................... H03K 13/22
[58] Field of Search ....................... 325/38 R, 38 B; 340/347 DD; 178/68; 332/17 P, 11 D; 179/15.55 R

[56] References Cited
UNITED STATES PATENTS

| | | | |
|---|---|---|---|
| 3,710,056 | 1/1973 | Tomozawa...................... | 325/38 B |
| 3,822,404 | 7/1974 | Crossier et al................... | 325/38 B |
| 3,825,831 | 7/1974 | Ishiguro........................... | 325/38 B |

Primary Examiner—Benedict V. Safourek
Attorney, Agent, or Firm—Hane, Baxley & Spiecens

[57] ABSTRACT

The invention relates to a device for converting an incoming analog signal into an outgoing PCM signal, comprising a Δ M-encoder in which a comparator circuit has a first and a second analog input of which the first analog input is arranged to be fed with the incoming signal and a digital output arranged to supply a delta signal with a clock frequency considerably higher than the upper limit frequency of the incoming signal and in which a feedback filter for the delta signal is connected between the digital output and the second analog input of the comparator circuit, and a digital Δ M-PCM converter in which a digital filter is connected to the digital output of the comparator circuit in the Δ M-encoder and is arranged to generate an average signal related to the delta signal and a PCM word generator is connected in cascade with the digital filter and is arranged to generate the outgoing PCM signal with a sampling frequency considerably lower than the clock frequency.

6 Claims, 3 Drawing Figures

DEVICE FOR CONVERTING AN INCOMING ANALOG SIGNAL INTO AN OUTGOING PCM SIGNAL

This invention relates to a device for converting an incoming analog signal into an outgoing PCM signal, comprising a Δ M-encoder in which a comparator circuit has a first and a second analog input of which the first analog input is arranged to be fed with the incoming signal and a digital output arranged to supply a delta signal with a clock frequency considerably higher than the upper limit frequency of the incoming signal and in which a feedback filter for the delta signal is connected between the digital output and the second analog input of the comparator circuit, and a digital Δ M-PCM converter in which a digital filter is connected to the digital output of the comparator circuit in the Δ M-encoder and is arranged to generate an average signal related to the delta signal and a PCM word generator is connected in cascade with the digital filter and is arranged to generate the outgoing PCM signal with a sampling frequency considerably lower than the clock frequency.

A device of the above-mentioned type is previously described by Goodman, D. J.: The application of delta modulation to analog-to-PCM encoding, Bell System Technical Journal 48, No. 2, February 1969, pp. 321–343. In principle it is based on an ideal single integration in the feedback filter in the Δ M-encoder and the generation of a primary and a secondary average signal in the digital filter of the Δ M-PCM converter corresponding to an integration and a subsequent low-pass filtering in the case of analog filters. The feedback filter has, however, the drawback of being complicated to implement owing to the need of precautions against noise and overloading, see for example Laane, R. R., Murphy, B. T.: Delta modulation codec for telephone transmission and switching applications, Bell System Technical Journal 49, No. 6, July-August 1970, pp. 1013–1031. This leads to the drawback that the spectrum of the Δ M-encoder has such a form that the secondary average signal of the digital filter can be kept at a low linear distortion level only if it is generated by a number of samples that is small in comparison with the ratio between the clock frequency of the Δ M-encoder and the sampling frequency of the PCM word generator. This means that the low-pass filtering in the digital filter scarcely can result in a sharp filtration of that out-band noise of the incoming analog signal which is folded into the frequency band of the same upon the sampling of the PCM signal, see Goodman, D. J., Greenstein, L. J.: Quantizing noise of Δ M-PCM encoders, Bell System Technical Journal 52, No. 2, February 1973, pp. 183–204.

An object of the invention is to provide a feedback filter which is uncomplicated in comparison with the feedback filter in the known device and which both eliminates the problems with noise and overloading in the Δ M-encoder and gives its spectrum such a form that it is possible to carry out with negligible linear distortion in the digital filter in Δ M-PCM converter a low-pass filtering of a large number of samples equal to the ratio between the clock frequency of the Δ M-encoder and the sampling frequency of the PCM word generator whereby the out-band noise of the incoming signal can be sharply filtered. Thus, the device of the invention can obtain a given accuracy for the PCM signal with regard to the incoming analog signal at a lower clock frequency in the Δ M-encoder than the known device.

Figure 2:
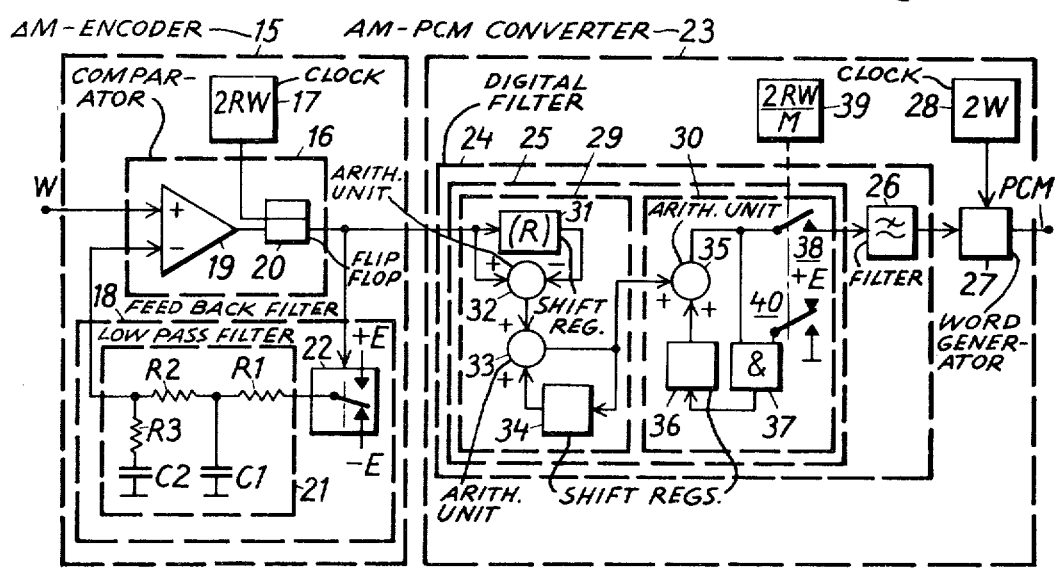
Figure 3:
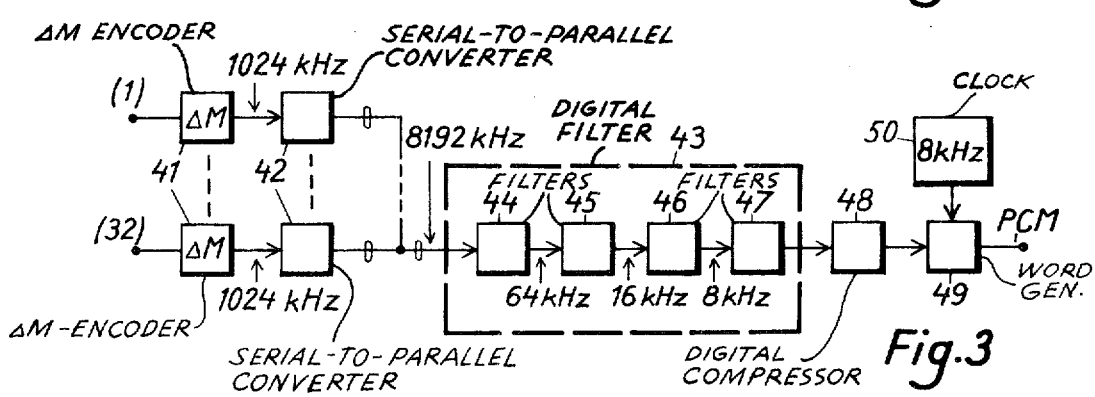

The device of the invention the characteristics of which appear from the appended claims, will now be described more in detail with reference to the accompanying drawing, where FIG. 1 shows a block diagram illustrating the principle of the known device, FIG. 2 shows a block diagram of an embodiment of the device according to the invention, and FIG. 3 shows a block diagram of a time multiplex arrangement in which the invention is applied.

FIG. 1 shows a known device for converting an incoming analog signal with a bandwidth W into an outgoing PCM signal with a sampling frequency 2W. The device includes a Δ M-encoder 1 in which a comparator circuit 2 has a first and a second analog input of which the first analog input is fed with the incoming analog signal and a digital output which under control of a clock generator 3 supplies a delta signal with a sampling frequency 2RW where R is a number of the magnitude $10^2$–$10^3$ and in which a feedback filter 4 for the delta signal is connected between the digital output and the second analog input of the comparator circuit 2. The comparator circuit 2 consists of a differential amplifier 5 which is connected in cascade with a flip-flop 6 clocked by the clock generator 3 and the feedback filter 4 comprises an integrator 7 which is fed from driving stage 8 with a current whose absolute amplitude value is a constant I and whose polarity is dependent on whether the delta signal has the binary value 1 or 0. The device comprises further a digital Δ M-PCM converter 9 in which a digital filter 10 is connected to the digital output of the comparator circuit 2 in the Δ M-encoder and is arranged to produce an average signal to the delta signal and a PCM word generator 11 is connected in cascade with the digital filter 10 and is under control of a clock generator 12 arranged to produce at the sampling frequency 2W the outgoing PCM signal from the average signal.

The digital filter 10 consists of: an up/down counter 15 which for a binary "one" of the delta signal counts forward and for a binary zero counts backward and thereby achieves a digital version of the incoming analog signal fed to the Δ M-encoder 1; and an averaging filter 14 which is connected in cascade with the up/down counter 13 and is arranged to carry out a low-pass filtration by means of N samplings of the outgoing signal of the up/down counter 13, where N is a number of the magnitude 10. For a more detailed description of the known device described here and especially of the digital filter 10 is referred to Goodman, D. J., The application of delta modulation to analog-to-PCM encoding, Bell System Technical Journal 48, No. 2, February 1969, pp. 321–343.

FIG. 2 shows an embodiment of the device of the invention for converting an incoming analog signal with a band width W to an outgoing PCM signal with a sampling frequency 2W. The device of the invention includes a Δ M-encoder 15 in which a comparator circuit 16 has a first and a second analog input of which the first analog input is fed with the incoming analog signal and a digital output which under control of a clock generator 17 supplies a delta signal with a sampling frequency 2RW where R according to the example is equal to 128 and in which a feedback filter 18 for the delta signal is connected between the digital output and the second analog input of the comparator circuit 16. The comparator circuit 16 consists as in the known device in FIG. 1 of a differential amplifier 19 which is connected in cascade with a flip-flop 20 clocked by the clock generator 17, while the feedback filter 18 includes a low pass filter 21 which is fed from a driving stage 22 with a voltage whose absolute amplitude value is a constant E and whose polarity is dependent on whether the delta signal has the binary value 1 or 0.

The low-pass filter 21 comprises a second-order RC-network which consists of two L-links connected in cascade and formed by a resistor $R_1$ and a capacitor $C_1$ and a resistor $R_2$ and a capacitor $C_2$ respectively. The capacitor $C_2$ is connected in series with a resistor $R_3$ that is small in comparison with the resistor $R_2$ for stabilizing the feedback in the Δ M-encoder 15, and which has two poles localized near the upper limit frequency of the incoming signal. According to the example, the upper limit frequency is 3400 Hz and the poles are localized at 2567 Hz and 5174 Hz respectively, the suitable component values being $R_1 = 564$ ohm, $R_2 = 3858$ ohm, $R_3 = 142$ ohm, $C_1 = 100$ nanofarad and $C_2 = 10$ nanofarad. The stabilization of the feedback in the Δ M-encoder 15 is achieved thereby that a zero is obtained at 112 kHz.

In the device of the invention there is further included a digital Δ M-PCM converter 23 comprising: a digital filter 24 connected to the digital output of the comparator circuit 16 in the Δ M-encoder and divided into a first filter block 25 arranged to generate an average signal from the delta signal and a second filter block 26 arranged to filter the average signal sharply from the quantizing and out-band noise and in addition to constitute a D.C. rejector; and a PCM word generator 27 connected in cascade with the digital filter 24 and arranged under control of a clock generator 28 to generate with the sampling frequency 2W the outgoing PCM signal from the filtered average signal. The filter block 25 is in its turn divided into a first filter circuit 29 arranged to generate a primary average signal from a number of samples of the delta signal equal to the number R which is the ratio between the clock frequency of the Δ M-encoder 15 and the sampling frequency of the PCM word generator 27 and according to the example is equal to 128, and a second filter circuit 30 arranged to produce a secondary average signal from M samples of the primary average signal, where M according to the example is equal to 16.

The filter circuit 29 includes a shift register 31 fed with the delta signal from the digital output of the comparator circuit 16 and arranged to supply on an output an outgoing signal consisting of the same delta signal delayed R periods of the clock frequency of the Δ M-encoder 15 for which purpose the shift register 31 consists of 128 stages according to the example. The binary value of the delayed delta signal is subtracted from the binary value of the delta signal fed into the shift register 31 by means of an 1-bit arithmetic unit 32 and the difference result is supplied to an 8-bit arithmetic unit 33 which adds it to the accumulated binary sum of an 8-bit register 34 and after that writes into the register 34 a new accumulated binary sum which in addition is fed to the filter circuit 30. In the filter circuit 30, a 12-bit arithmetic unit 35 continuously adds the accumulated binary sum received from the filter circuit 29 to a second binary sum accumulated in a register 36 and then writes a new accumulated sum into the register 36 via an AND-gate 37. The accumulated sum which is received from the arithmetic unit 35 after M summations, where M according to the example is equal to 16, is further fed from the filter block 25 to the filter block 26 via a sampling contact 38 controlled by a clock generator 39 with a clock frequency 2RW/M, the register 36 simultaneously being reset by inhibiting the writing into it from the arithmetic unit 35 by means of an inhibition contact 40 connected to a control input of the AND-gate 37 and controlled from the clock generator 39 in synchronism with the sampling contact 38.

The accumulated binary sum supplied from the filter circuit 29 consists of the primary average signal while the accumulated binary sum supplied from the filter circuit 30 consists of the secondary average signal. Both are a digital version of the analog signal incoming to the Δ M-encoder 15 and constitute an average signal to the delta signal from the comparator circuit 16.

The purpose of the filter block 26 is to filter the digital version of the analog signal incoming to the Δ M-encoder 15 sharply from the quantizing and out-band noise received from the filter block 25 and furthermore to constitute a D.C. rejector before the PCM word generator 27. An example will be given below of a suitable embodiment of the filter block 26.

In FIG. 3 a block diagram is shown of a time multiplex arrangement in which the invention is applied. Individual Δ M-encoders 41 corresponding to the Δ M-encoder 15 in FIG. 2 are according to the example arranged for 32 incoming telephone channels and are connected via a respective series-parallel converter 42 to a time mutiplexed digital filter 43 which is divided into 4 filter blocks 44, 45, 46 and 47 is, via a digital compressor 48 for conversion from a linear code received from the digital filter 43 to a compressed code adapted for PCM-transmission, connected to a PCM word generator 49 which under control of a clock generator 50 is arranged to generate with a sampling frequency of 8 kHz an 8-bit PCM word per incoming telephone channel. According to the example, each of the series-parallel converters 42 consists of a 4-stage shift register whose respective stages are connected in parallel to the digital filter 43 via 4 gate circuits controlled by a control unit (not shown) in the time multiplex arrangement, a clock frequency of 1024 kHz for the Δ M-encoders 41 resuting in a transmission frequency of 8192 kHz between them and the digital filter 43.

The filter block 44 in the digital filter 43 corresponds to the filter block 25 in FIG. 2 while the filter blocks 45, 46 and 47 together correspond to the filter block 26 which according to the example is divided in this manner in order to reduce the necessary number of arithmetical operations. The filter blocks 44, 45, 46 and 47 work according to the example with the sampling frequencies 1024 kHz, 64 kHz, 16 uHz 8 kHz respectively and have the transmission function $H = H_1 \cdot H_2 \cdot H_3 \cdot H_4$, where $H_1 = ((1 - z^{-128})/(1 - z^{-1}))((1 - z^{-16})/(1 - z^{-1}))$, $H_2 = (1 + z^{-1})^2 (1 + z^{-2})^3 (1 + z^{-4})$, $$H_3 = A_0 z^{-8} + z^{-8} \sum_{j=1}^{8} A_j(z^{+j} + z^{-j})$$

and $$H_1 = (1 - z^{-1}) / (1 - K z^{-1}).$$

We claim:

1. Apparatus for converting an incoming analog signal into an outgoing PCM signal comprising: a Δ M-encoder having a comparator circuit with a first analog input adapted to receive the incoming signal, a second analog input and a digital output arranged to supply a delta signal with a clock frequency considerably higher than the upper limit frequency of the incoming signal, a feedback filter for the delta signal connected between said digital output and said second analog input of the comparator circuit, said feedback filter being formed as a low-pass filter comprising a second-order RC-network having two poles localized near the upper limit frequency of the incoming signal; and a digital Δ M-PCM converter operating at a given sampling frequency and having a digital filter means connected to said digital output of said comparator circuit in said Δ-encoder for generating an average signal from a number of samples of the delta signal at least equal to the ratio between said clock frequency and said sampling frequency, and a PCM word generator means connected in cascade with said digital filter for generating the outgoing PCM signal with a sampling frequency considerably lower than said clock frequency.

2. Apparatus according to claim 1 wherein digital filter means includes a first filter means which is arranged to work with a writing frequency equal to said clock frequency and a reading frequency equal to the writing frequency divided by a selected integer power of two, said first filter means being divided into a first filter circuit arranged to generate a primary average signal of the delta signal from a number of samples of said delta signal at least equal to said integer power of two and a second filter circuit connected in cascade with said first filter circuit and arranged to generate a secondary average signal of the delta signal from a number of samples of the primary average signal equal to said integer power of two.

3. Apparatus according to claim 2 wherein the first filter circuit comprises a shift register which as a number of stages equal to said ratio and which has an input arranged to be fed with the delta signal and an output arranged to supply a delta signal delayed by a number of periods of said clock frequency equal to said ratio, an arithmetic unit connected to the input and the output of the shift register and arranged to subtract the binary value of the delayed delta signal from the binary value of the actual delta signal, and an accumulator unit connected to the arithmetic unit and arranged to accumulate the difference result from the arithmetic unit upon said subtraction.

4. Apparatus according to claim 2 wherein the digital filter comprises a second filter means connected in cascade with the first filter means and arranged to filter the secondary average signal sharply from the quantizing and out-band noise and to constitute a D.C. rejector for the PCM word generator.

5. Apparatus according to claim 3 wherein the second filter means is divided into a number of filter sections connected in cascade and arranged to work with successively reduced sampling frequencies related to the sampling frequency of the outgoing PCM signal as integer powers of 2.

6. Time multiplex arrangement, comprising a number of M-encoders and a time multiplexed digital filter according to claim 1, each of said M-encoders being provided with a series-parallel converter comprising a shift register which is arranged to be fed with the delta signal in a serial form and to forward it in a parallel form to the time multiplexed digital filter and gating means controlling the transfer of the delta signal from the shift register to the time multiplexed filter.

* * * * *